(12) United States Patent
Chiang et al.

(10) Patent No.: US 11,508,772 B2
(45) Date of Patent: Nov. 22, 2022

(54) IMAGE SENSOR AND MANUFACTURING METHOD THEREOF

(71) Applicant: Industrial Technology Research Institute, Hsinchu (TW)

(72) Inventors: Chia-Wen Chiang, Hsinchu (TW); Hsiang-Hung Chang, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 3 days.

(21) Appl. No.: 17/159,147

(22) Filed: Jan. 27, 2021

(65) Prior Publication Data

US 2021/0151491 A1    May 20, 2021

Related U.S. Application Data

(62) Division of application No. 16/231,958, filed on Dec. 25, 2018, now Pat. No. 10,943,938.

(30) Foreign Application Priority Data

Dec. 6, 2018 (TW) ................. 107143943

(51) Int. Cl.
*H01L 27/146* (2006.01)
*H04N 5/225* (2006.01)

(52) U.S. Cl.
CPC .... *H01L 27/14632* (2013.01); *H01L 27/1469* (2013.01); *H01L 27/14634* (2013.01);
(Continued)

(58) Field of Classification Search
CPC ......... H01L 27/14618; H01L 27/14607; H01L 27/14627; H01L 27/14632; H01L 27/14643–14663; H01L 27/1465; H01L 27/14649; H01L 27/14659; H01L 27/14665; H01L 27/14669; H01L 27/14678; H01L 27/14683; H01L 27/14681; H01L 27/1469; H01L 27/14692;
(Continued)

(56) References Cited

U.S. PATENT DOCUMENTS 6,791,072 B1    9/2004  Prabhu
9,985,059 B2 *  5/2018  Shin ..................... H04N 5/2253
(Continued)

FOREIGN PATENT DOCUMENTS

JP         2005260436        9/2005

OTHER PUBLICATIONS

"Office Action of China Counterpart Application", dated Mar. 28, 2022, p. 1-p. 12.

*Primary Examiner* — Natalia A Gondarenko
(74) *Attorney, Agent, or Firm* — JCIPRNET

(57) ABSTRACT

An image sensor including a substrate and an image sensing element is provided. The substrate has an arc surface. The image sensing element is disposed on the arc surface and curved to fit a contour of the arc surface. The image sensing element has a front surface and a rear surface opposite to the front surface and has at least one bonding wire, the bonding wire is connected between the front surface and the substrate, and the rear surface of the image sensing element directly contacts the arc surface. In addition, a manufacturing method of the image sensor is also provided.

7 Claims, 8 Drawing Sheets

(52) U.S. Cl.
CPC .. *H01L 27/14636* (2013.01); *H01L 27/14687* (2013.01); *H04N 5/2253* (2013.01)

(58) Field of Classification Search
CPC ......... H01L 27/14687; H01L 27/14634; H01L 27/14636; H01L 27/14806; H01L 27/14812; H01L 27/307; H01L 27/3293; H01L 2224/4141; H01L 2224/42; H01L 2224/44; H01L 2224/45; H01L 2224/4503; H01L 2224/45032; H01L 2224/47; H01L 2224/48; H01L 2224/4805; H01L 2224/48105; H01L 2224/4811; H01L 2224/48111; H01L 2224/48138; H01L 2224/48145; H01L 2224/48165; H01L 2224/48235; H01L 2224/90; H01L 2224/95091; H01L 2224/951; H01L 2924/12043; H01L 24/90; H01L 25/167; H01L 21/447; H01L 31/02024; H01L 31/0224; H01L 31/022416; H01L 31/107; H04N 5/2253; H04N 5/335; H04N 5/374
USPC ............... 257/291, 444, 431, 31.124, 31.127
See application file for complete search history.

(56) References Cited

U.S. PATENT DOCUMENTS

| | | |
|---|---|---|
| 2006/0038183 A1 | 2/2006 | Oliver |
| 2006/0186492 A1 | 8/2006 | Boettiger et al. |
| 2009/0115875 A1 | 5/2009 | Choi et al. |
| 2016/0163751 A1* | 6/2016 | Sugiyama ......... H01L 27/14625 257/432 |
| 2016/0260761 A1* | 9/2016 | Jun .................. H01L 27/14618 |
| 2016/0286102 A1 | 9/2016 | Sulfridge et al. |
| 2017/0301710 A1 | 10/2017 | Shin et al. |
| 2017/0323915 A1* | 11/2017 | Tanaka ............. H01L 27/14625 |

* cited by examiner

IMAGE SENSOR AND MANUFACTURING METHOD THEREOF

CROSS-REFERENCE TO RELATED APPLICATION

This application is a divisional application of and claims the priority benefit of U.S. application Ser. No. 16/231,958, filed on Dec. 25, 2018, now allowed, which claims the priority benefit of Taiwan application serial no. 107143943, filed on Dec. 6, 2018. The entirety of each of the above-mentioned patent applications is hereby incorporated by reference herein and made a part of this specification.

BACKGROUND

Technical Field

The disclosure relates to an image sensor and a manufacturing method thereof, and particularly relates to an image sensor including a curved image sensing element and a manufacturing method thereof.

Description of Related Art

In recent years, due to booming development of multimedia technology, the use of digital images has become more frequent, and the demand for image processing devices by consumers is increased. Many digital image products such as web cameras, digital cameras, smart phones, etc., adopt image sensors to capture images.

A Complementary Metal Oxide Semiconductor (CMOS) image sensing element may be designed into a curved shape to change optical properties thereof, so as to reduce the number of required lenses to achieve miniaturization of an image sensing module. Generally, the image sensing element that is still not curved is first placed on an arc surface of a substrate, where the arc surface of the substrate has a through hole aligned with the image sensing element, and then the image sensing element is driven to bend downward to attach the arc surface of the substrate by extracting air through the through hole, so as to obtain the curved image sensing element. However, according to such method, the through hole used for air extraction has to be first formed on the substrate, which makes the manufacturing process more trouble and time-consuming, and due to the through hole, a structure of the substrate is not integral and cannot stably support the image sensing element, which probably causes unexpected deformation of the image sensing element at the through hole.

SUMMARY

The disclosure is directed to an image sensor, which is adapted to stably support an image sensing element.

The disclosure provides an image sensor including a substrate and an image sensing element. The substrate has an arc surface. The image sensing element is disposed on the arc surface and curved to fit a contour of the arc surface. The image sensing element has a front surface and a rear surface opposite to each other and has at least one first conductive via. The rear surface of the image sensing element directly contacts the arc surface, and the first conductive via is extended from the front surface to the rear surface.

The disclosure provides an image sensor including a substrate and an image sensing element. The substrate has an arc surface. The image sensing element is disposed on the arc surface and curved to fit a contour of the arc surface. The image sensing element has a front surface and a rear surface opposite to each other and has at least one bonding wire. The bonding wire is connected between the front surface and the substrate, and the rear surface of the image sensing element directly contacts the arc surface.

The disclosure provides a manufacturing method of an image sensor, which includes following steps. At least one image sensing element and a substrate are provided. A pressing element is provided, where the pressing element has at least one protrusion portion. The at least one image sensing element is pressed to the substrate by the at least one protrusion portion, such that the at least one image sensing element is curved to form at least one arc surface on the substrate.

Based on the above description, the image sensing element is pressed to the substrate by the protrusion portion of the pressing element, such that the image sensing element is curved to form the arc surface on the surface of the substrate. In the disclosure, since the image sensing element is curved by the aforementioned method, it is unnecessary to form a through hole used for air exhaustion on the substrate as that does of the conventional manufacturing process, which simplifies the manufacturing process and saves manufacturing cost. Moreover, since the substrate of the disclosure is unnecessary to form the through hole, the structure of the substrate is integral, and is adapted to stably support the image sensing element.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
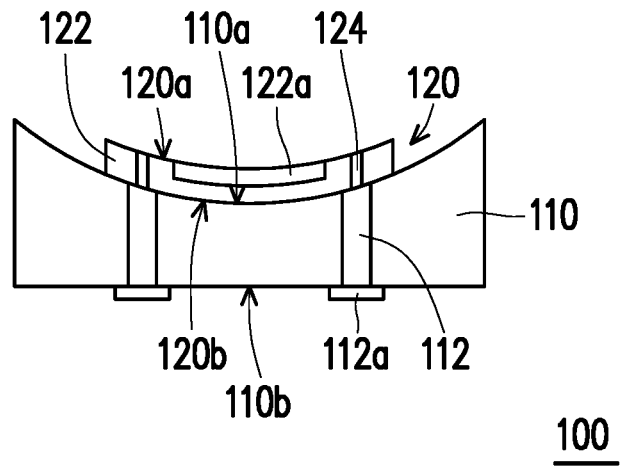
FIG. 1 is a schematic view of an image sensor according to an embodiment of the disclosure.

FIG. 1 is a schematic view of an image sensor according to an embodiment of the disclosure. Referring to FIG. 1, the image sensor 100 of the embodiment includes a substrate 110 and an image sensing element 120. The substrate 110 has an arc surface 110a, and the arc surface 110a is a concave arc surface. The image sensing element 120 is disposed on the arc surface 110a and is curved to fit a contour of the arc surface 110a. A curvature of the image sensing element 120 is identical to a curvature of the arc surface 110a, and the image sensing element 120 directly contacts the arc surface 110a.

In the embodiment, the image sensing element 120 includes an image sensing chip 122, and the image sensing chip 122 directly contacts the arc surface 110a and has a sensing unit 122a, where the sensing unit 122a is, for example, a COMS image sensing unit. The type of the image sensing chip 122 is not limited by the disclosure, which may be other proper type of a sensing chip.

Figure 2A:
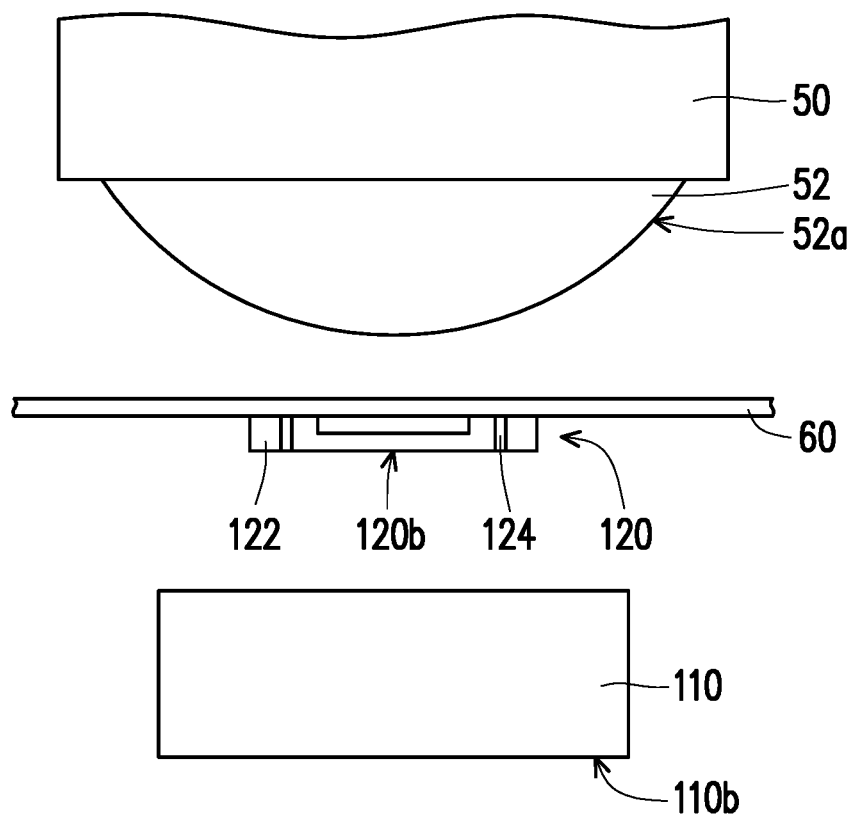
FIG. 2A and FIG. 2B illustrate a manufacturing flow of the image sensor of FIG. 1.
Figure 2B:
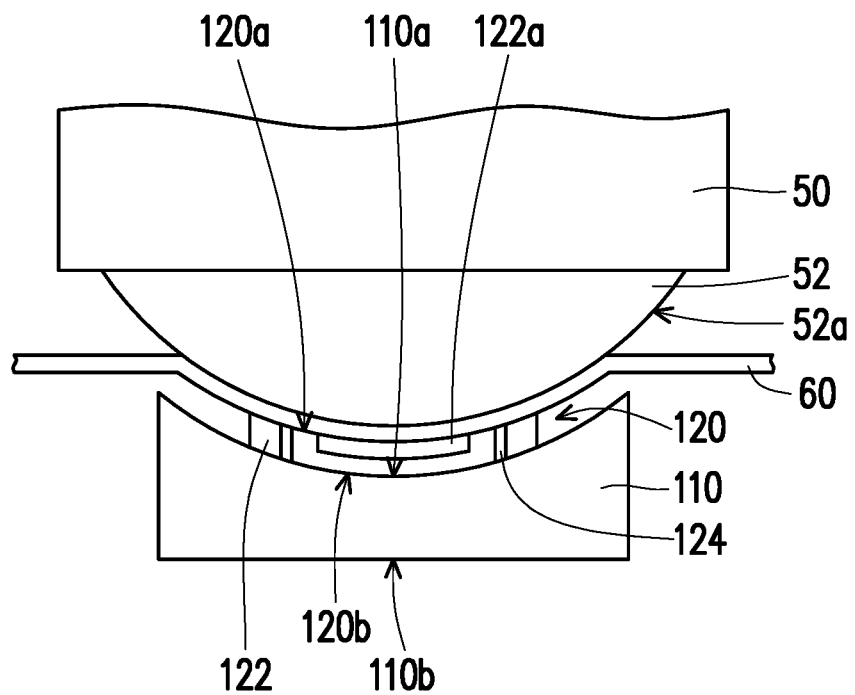

A manufacturing process of the image sensor 100 of the embodiment is described below. FIG. 2A and FIG. 2B illustrate a manufacturing flow of the image sensor of FIG. 1. First, as shown in FIG. 2A, the image sensing element 120 and the substrate 110 are provided. Moreover, a pressing element 50 is provided, where the pressing element 50 has a protrusion portion 52, and the protrusion portion 52 has a convex arc surface 52a. Then, as shown in FIG. 2B, the image sensing element 120 is pressed to the substrate 110 by the convex arc surface 52a of the protrusion portion 52, such that the image sensing element 120 is curved to form the arc surface 110a on the substrate 110. In the embodiment, a material of the substrate 110 is, for example, silicone, epoxy or wax, etc., so that the substrate 110 is adapted to be pressed to sink based on a deformable characteristic thereof, and is suitable for thermal curing or light curing.

As described above, the protrusion portion 52 of the pressing element 50 presses the image sensing element 120 to the substrate 110, and the image sensing element 120 is curved to form the arc surface 110a on the surface of the substrate 110. In the embodiment, since the image sensing element 120 is curved by the above method other than an air extraction method of the conventional technique, it is unnecessary to form a through hole used for air exhaustion on the substrate 110 as that does of the conventional manufacturing process, which simplifies the manufacturing process and saves manufacturing cost. Moreover, since the substrate 110 of the embodiment has no through hole on the arc surface 110a, the structure of the substrate 110 is integral, and is adapted to stably support the image sensing element 120. Moreover, the arc surface 110a of the substrate 110 directly contacts the image sensing element 120 as that described above, which avails stably supporting the image sensing element 120.

In detail, during the aforementioned manufacturing process of the image sensor 100 of the embodiment, as shown in FIG. 2A, a temporary carrier 60 (for example, a carrier film) is adopted to carry the image sensing chip 122, and the temporary carrier 60 faces the protrusion portion 52 of the pressing element 50. Then, as shown in FIG. 2B, the temporary carrier 60 and the image sensing chip 122 are altogether pressed to the substrate 110 by the protrusion portion 52. After the pressing element 50 is separated from the temporary carrier 60, at least one second conductive via (two second conductive vias are illustrated) extending from the arc surface 110a to a bottom surface 110b opposite to the arc surface 110a is formed on the substrate 110, and pads 112a corresponding to the second conductive vias 112 are formed on the bottom surface 110b, and the image sensing element 120 is electrically connected to the second conductive vias 112 to complete the image sensor 100 shown in FIG. 1.

The method that the image sensing element 120 electrically connected to the second conductive vias 112 is described below. The image sensing element 120 of the embodiment has a front surface 120a and a rear surface 120b opposite to each other, where the rear surface 120b faces the arc surface 110a of the substrate 110 and covers the second conductive vias 112. The image sensing element 120 further has at least one first conductive via 124 (two first conductive vias are illustrated), and the first conductive vias 124 are, for example, through silicon vias (TSV), and extend from the front surface 120a to the rear surface 120b to electrically connect the image sensing element 120 to the second conductive vias 112. In other embodiments, the image sensing element 120 may be electrically connected to the second conductive vias 112 through other proper manner.

Figure 3:
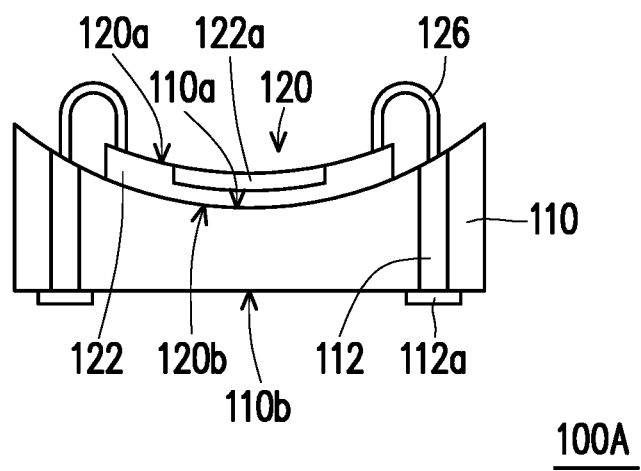
FIG. 3 is a schematic view of an image sensor according to another embodiment of the disclosure.

FIG. 3 is a schematic view of an image sensor according to another embodiment of the disclosure. A difference between the image sensor 100A of FIG. 3 and the image sensor 100 of FIG. 1 is that the image sensing element 120 of FIG. 3 does not have the first conductive vias 124 shown in FIG. 1, but has at least one bonding wire 126 (two bonding wires are illustrated). The bonding wires 126 are connected between the front surface 120a of the image sensing element 120 and the second conductive vias 112, so as to electrically connect the image sensing element 120 to the second conductive vias 112. In the embodiment, after the curved image sensing element 120 and the arc surface 110a of the substrate 110 are formed, the bonding wires 126 are formed by a wire bonding process.

Figure 4A:
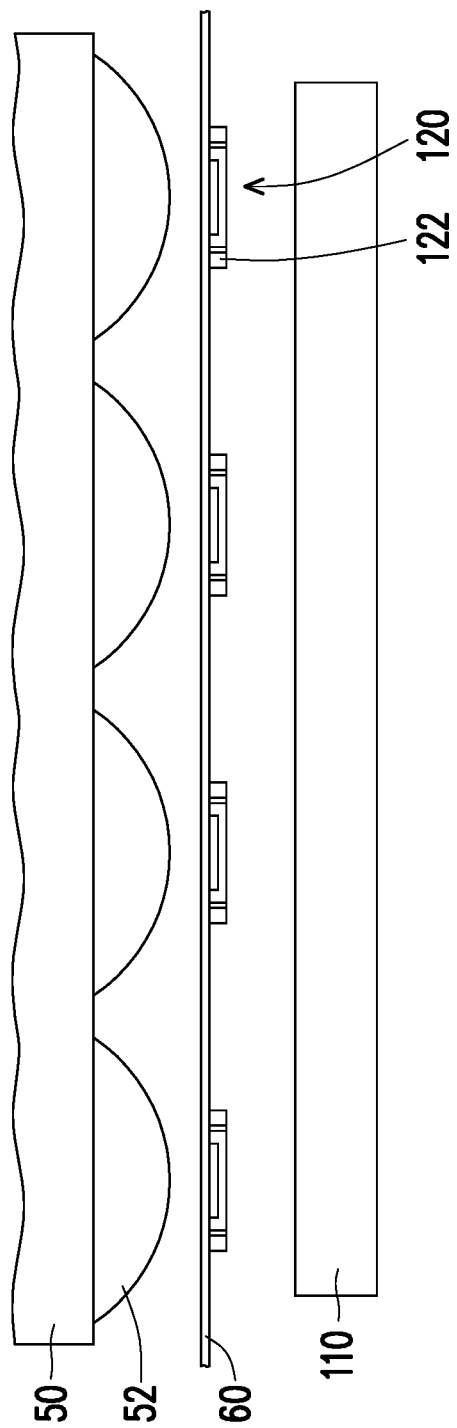
FIG. 4A to FIG. 4E illustrate a manufacturing flow of an image sensor according to another embodiment of the disclosure.
Figure 4B:
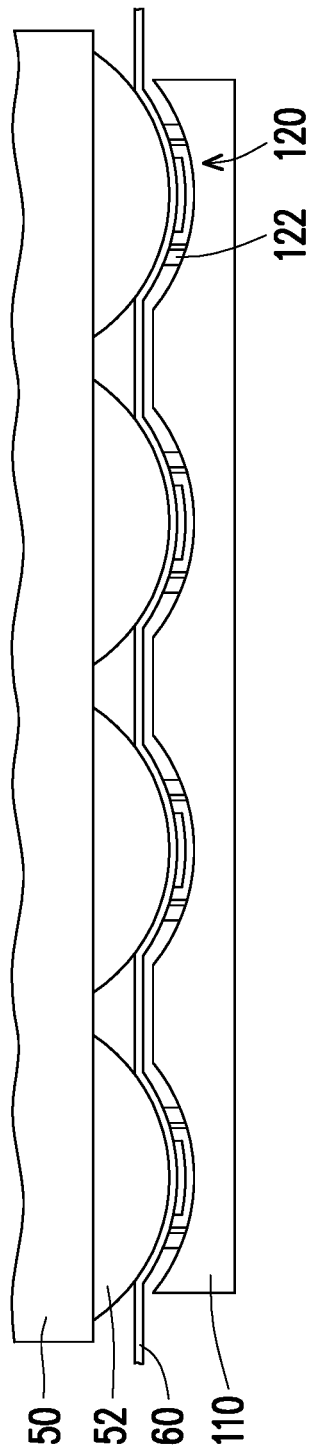
Figure 4C:
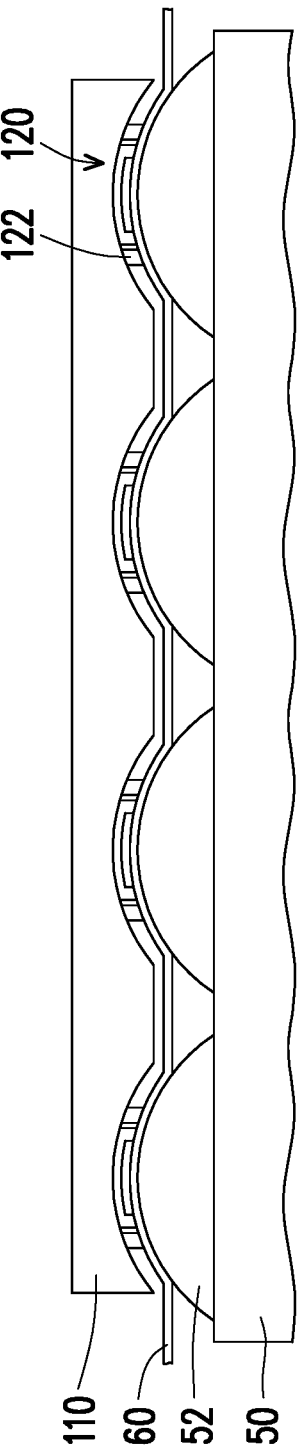
Figure 4D:
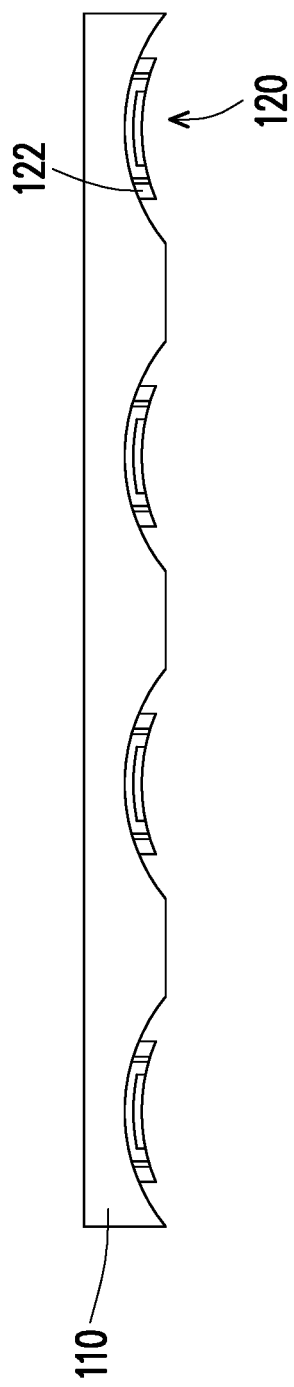
Figure 4E:
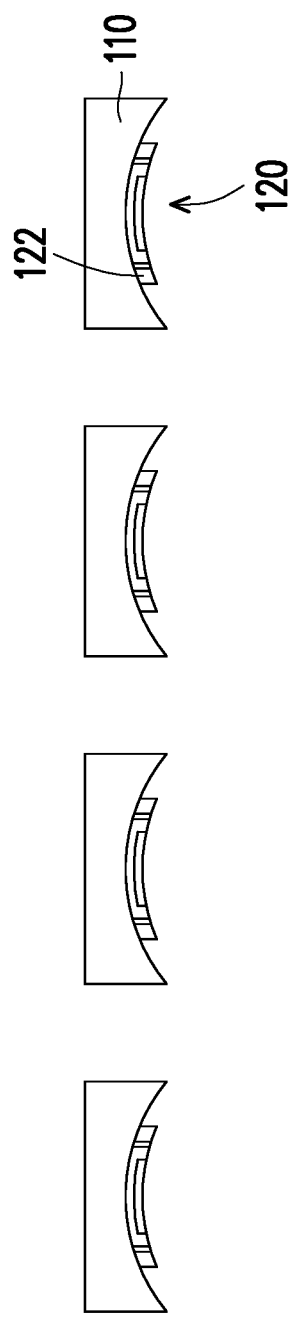

FIG. 4A to FIG. 4E illustrate a manufacturing flow of an image sensor according to another embodiment of the disclosure. A difference between the manufacturing flow of FIG. 4A to FIG. 4E and the manufacturing flow of FIG. 2A and FIG. 2B is that as shown in FIG. 4A to FIG. 4B, a plurality of image sensing chips 122 on the temporary carrier 60 are respectively pressed to the substrate 110 by a plurality of protrusion portions 52. Then, as shown in FIG. 4C, the pressed image sensing chips 122, the temporary carrier 60 and the substrate 110 are flipped over. Then, the pressing element 50 and the temporary carrier 60 are removed to become a state shown in FIG. 4D, and as shown in FIG. 4E, the substrate 110 is cut to implement miniaturization. Finally, the second conductive vias 112 are produced on each of the miniaturization structures of FIG. 4E to complete manufacturing the plurality of image sensors 100 shown in FIG. 1. The image sensors 100A shown in FIG. 3 may also be manufactured according to the similar method, and detail thereof is not repeated.

Figure 5:
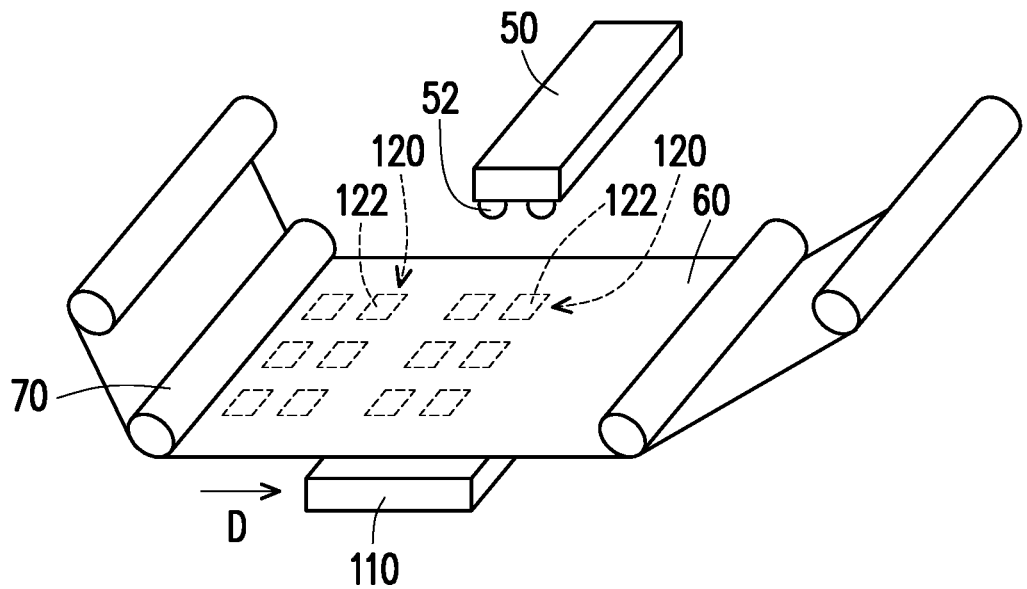
FIG. 5 illustrates a manufacturing method of an image sensor according to another embodiment of the disclosure.

FIG. 5 illustrates a manufacturing method of an image sensor according to another embodiment of the disclosure. Besides that the aforementioned temporary carrier 60 is used for carrying the image sensing chips 122 during the manufacturing process, as shown in FIG. 5, the temporary carrier 60 may be further driven by rollers 70 to transport the image sensing chips 122 to a position of the pressing element 50 along a direction D, and a part of the temporary carrier 60 and the corresponding image sensing chips 122 are pressed to the substrate 110 through the protrusion portions 52 of the pressing element 50. After the pressing step is performed, another unpressed substrate 110 is provided to the place where the original substrate 110 is placed, and another group of the image sensing chips 122 is moved to the position of the pressing element 50 along the direction D through the temporary carrier 60, so as to perform another pressing step.

Figure 6:
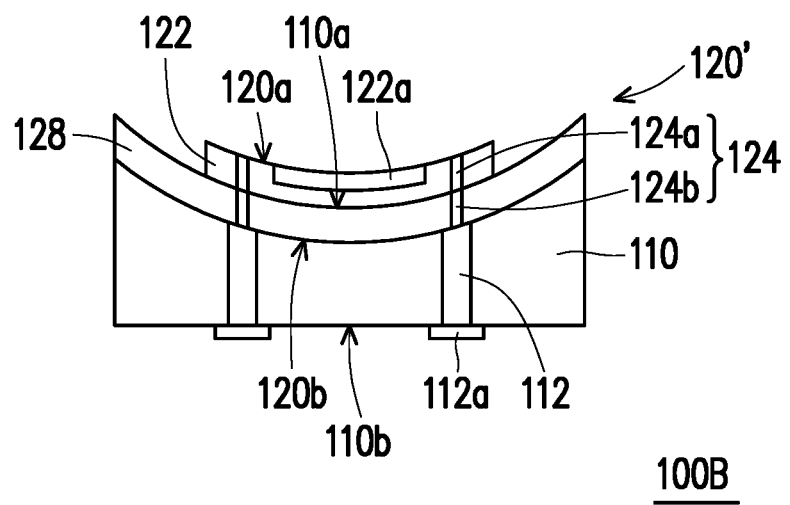
FIG. 6 is a schematic view of an image sensor according to another embodiment of the disclosure.

FIG. 6 is a schematic view of an image sensor according to another embodiment of the disclosure. A difference between the image sensor 100B shown in FIG. 6 and the image sensor 100 shown in FIG. 1 is that besides the image sensing chip 122, the image sensing element 120' of FIG. 6 further includes a carrier board 128, the image sensing chip 122 is disposed on the carrier board 128, and the carrier board 128 directly contacts the arc surface 110a of the substrate 110. Each of the first conductive vias 124 includes a first section 124a formed in the image sensing chip 122 and a second section 124b formed in the carrier board 128 for connecting the second conductive vias 112 of the substrate 110. In the embodiment, the carrier board 128 is, for example, a flexible Printed Circuit Board (PCB) and is adapted to be curved. In other embodiments, the carrier board 128 may be other types of bendable carrier board, which is not limited by the disclosure.

Figure 7A:
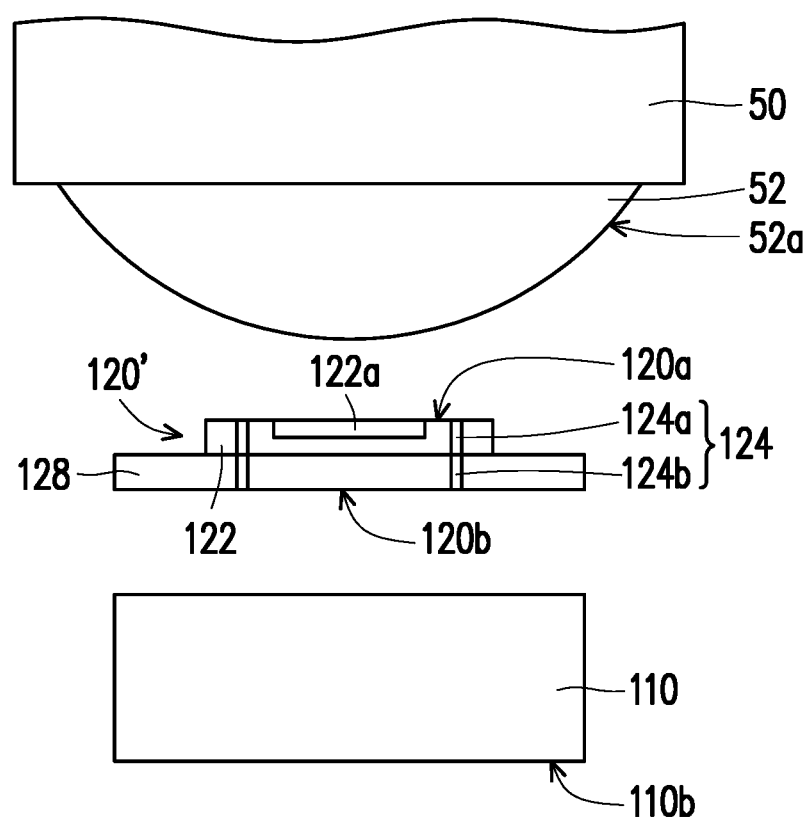
FIG. 7A and FIG. 7B illustrate a manufacturing flow of the image sensor of FIG. 6.
Figure 7B:
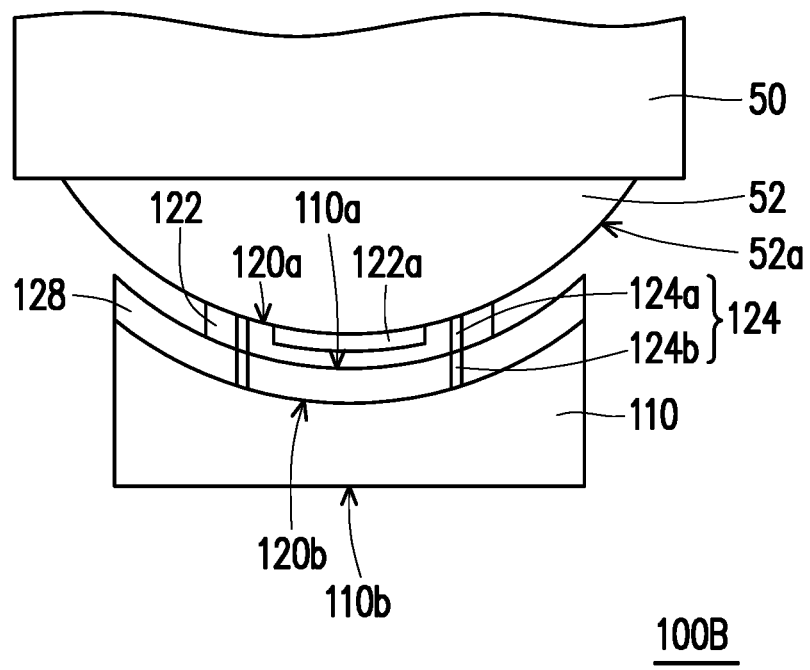

FIG. 7A and FIG. 7B illustrate a manufacturing flow of the image sensor of FIG. 6.

The manufacturing flow of the image sensor 100B of the embodiment is similar to the manufacturing flow of the image sensor 100 shown in FIG. 2A and FIG. 2B, though in the manufacturing flow of the image sensor 100B, instead of carrying the image sensing chip 122 by the temporary carrier 60 as shown in FIG. 2A, the carrier board 128 is directly used as the carrier of the image sensing chip 122. As shown in FIG. 7A, the carrier board 128 faces to the substrate 110, and as shown in FIG. 7B, the carrier board 128 and the image sensing chip 122 are pressed to the substrate 110 by using the protrusion portion 52. Then, as shown in FIG. 6, at least one second conductive via 112 (two second conductive vias are illustrated) extending from the arc surface 110a thereof to the bottom surface 110b opposite to the arc surface 110a is formed on the substrate 110, and the pads 112a corresponding to the second conductive vias 112 are formed on the bottom surface 110b, and the image sensing element 120 is electrically connected to the second conductive vias 112 to complete the image sensor 100B shown in FIG. 6. In other embodiments, the image sensing element 120' may be electrically connected to the second conductive vias 112 through other proper manner, which is described below with reference of a figure.

Figure 8:
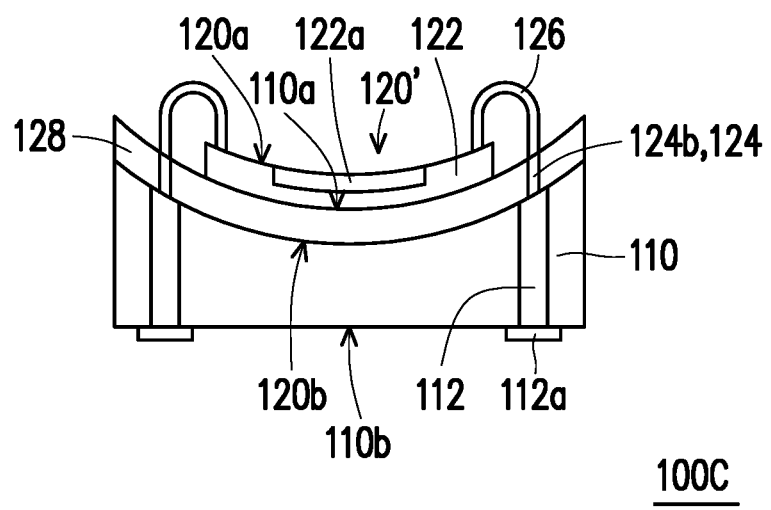
FIG. 8 is a schematic view of an image sensor according to another embodiment of the disclosure.

FIG. 8 is a schematic view of an image sensor according to another embodiment of the disclosure. A difference between the image sensor 100C of FIG. 8 and the image sensor 100B of FIG. 6 is that the first conductive vias 124 of FIG. 8 do not have the first section 124a shown in FIG. 6, but have at least one bonding wire 126 (two bonding wires are illustrated). The bonding wires 126 are connected between the front surface 120a of the image sensing element 120' and the second sections 124b of the first conductive vias 124, such that the image sensing element 120' is electrically connected to the second conductive vias 112. In the embodiment, after the curved image sensing element 120' and the arc surface 110a of the substrate 110 are formed, the bonding wires 126 are formed through a wire bonding process.

In summary, the image sensing element is pressed to the substrate by the protrusion portion of the pressing element, such that the image sensing element is curved to form the arc surface on the surface of the substrate. In the disclosure, since the image sensing element is curved by the aforementioned method other than the air extraction manner, it is unnecessary to form a through hole used for air extraction on the substrate as that does of the conventional manufacturing process, which simplifies the manufacturing process and saves manufacturing cost. Moreover, since the substrate of the disclosure is unnecessary to form the through hole, the structure of the substrate is integral, and is adapted to stably support the image sensing element. Moreover, the arc surface of the substrate directly contacts the image sensing element, which avails stably supporting the image sensing element.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. An image sensor, comprising:
a substrate, having an arc surface; and
an image sensing element, disposed on the arc surface and curved to fit a contour of the arc surface, wherein the image sensing element has a front surface and a rear surface opposite to the front surface and has at least one bonding wire, the at least one bonding wire is connected between the front surface and the arc surface of substrate, the rear surface of the image sensing element directly contacts the arc surface, the substrate has a bottom surface and at least one side surface, the bottom surface is opposite to the arc surface, and the at least one side surface is connected between the arc surface and the bottom surface and is perpendicular to the bottom surface.

2. The image sensor as claimed in claim 1, wherein a curvature of the image sensing element is identical to a curvature of the arc surface.

3. The image sensor as claimed in claim 1, wherein the arc surface is a concave arc surface.

4. The image sensor as claimed in claim 1, wherein the image sensing element comprises an image sensing chip, and the image sensing chip directly contacts the arc surface.

5. The image sensor as claimed in claim 1, wherein the image sensing element comprises an image sensing chip and a carrier board, the image sensing chip is disposed on the carrier board, and the carrier board directly contacts the arc surface.

6. The image sensor as claimed in claim 1, wherein the substrate has no through hole on the arc surface.

7. The image sensor as claimed in claim 1, wherein the substrate has a bottom surface and at least one second conductive via, the bottom surface is opposite to the arc surface, the at least one second conductive via is extended from the arc surface to the bottom surface, and the at least one bonding wire is connected to the at least One second conductive via.

* * * * *